United States Patent
Maeda

(10) Patent No.: US 10,100,398 B2
(45) Date of Patent: Oct. 16, 2018

(54) MAGNETIC RECORDING MEDIUM, METHOD OF MANUFACTURING THE SAME, AND MAGNETIC RECORDING/REPRODUCTION APPARATUS

(71) Applicant: Kabushiki Kaisha Toshiba, Tokyo (JP)

(72) Inventor: Tomoyuki Maeda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 793 days.

(21) Appl. No.: 14/602,229

(22) Filed: Jan. 21, 2015

(65) Prior Publication Data

US 2015/0129415 A1    May 14, 2015

Related U.S. Application Data

(62) Division of application No. 13/051,640, filed on Mar. 18, 2011.

(30) Foreign Application Priority Data

Mar. 30, 2010    (JP) .................. 2010-079075

(51) Int. Cl.
   *C23C 14/08*    (2006.01)
   *C23C 14/10*    (2006.01)
   (Continued)

(52) U.S. Cl.
   CPC ............ *C23C 14/08* (2013.01); *C23C 14/083* (2013.01); *C23C 14/10* (2013.01); *C23C 14/16* (2013.01);
   (Continued)

(58) Field of Classification Search
   CPC .......... C23C 14/16; C23C 14/08; C23C 14/10; C23C 14/83; C23C 14/3414;
   (Continued)

(56) References Cited

U.S. PATENT DOCUMENTS 7,892,663 B2    2/2011    Nakagawa et al.
8,142,916 B2    3/2012    Umezawa et al.
(Continued)

FOREIGN PATENT DOCUMENTS

JP    2000-76638    3/2000
JP    2003-36525    2/2003
(Continued)

OTHER PUBLICATIONS

Notice of Reasons for Rejection, Japanese Patent Application 2010-079075, dated Aug. 9, 2011.

*Primary Examiner* — Michael A Band
(74) *Attorney, Agent, or Firm* — Knobbe, Martens, Olson & Bear, LLP

(57) ABSTRACT

According to one embodiment, a perpendicular magnetic recording layer comprises a granular film type recording layer and a continuous film type recording layer. The granular film type recording layer comprises a first granular film type recording layer in which magnetic crystal grains in a film plane has an average crystal grain diameter of 3 to 7 nm, and a second granular film type recording layer including magnetic crystal grains having an in plane average crystal grain diameter larger than that of the magnetic crystal grains of the first granular film type recording layer.

2 Claims, 2 Drawing Sheets

(51) Int. Cl.
*C23C 14/34* (2006.01)
*C23C 14/16* (2006.01)
*H01J 37/34* (2006.01)
*G11B 5/66* (2006.01)
*G11B 5/73* (2006.01)
*G11B 5/667* (2006.01)
*G11B 5/851* (2006.01)
*G11B 5/65* (2006.01)

(52) U.S. Cl.
CPC ............ *C23C 14/3414* (2013.01); *G11B 5/66* (2013.01); *G11B 5/667* (2013.01); *G11B 5/732* (2013.01); *G11B 5/7325* (2013.01); *G11B 5/851* (2013.01); *H01J 37/3429* (2013.01); *G11B 5/65* (2013.01)

(58) Field of Classification Search
CPC . C23C 14/083; H01J 37/3426; H01J 37/3429; G11B 5/66; G11B 5/732; G11B 5/7325; G11B 5/667; G11B 5/851
See application file for complete search history.

(56) References Cited

U.S. PATENT DOCUMENTS

| | | | |
|---|---|---|---|
| 8,367,229 B2 | 2/2013 | Sasaki | |
| 8,580,410 B2 | 11/2013 | Onoue | |
| 2008/0180843 A1 | 7/2008 | Zhang et al. | |
| 2008/0182131 A1 | 7/2008 | Iwasaki | |
| 2008/0186627 A1 | 8/2008 | Hirayama et al. | |
| 2009/0052074 A1 | 2/2009 | Nakagawa et al. | |
| 2009/0141399 A1 | 6/2009 | Sakawaki et al. | |
| 2009/0183985 A1* | 7/2009 | Yoshida ................ | B82Y 25/00 204/192.15 |
| 2009/0242389 A1* | 10/2009 | Asakura et al. ......... | C23C 14/14 204/192.15 |
| 2009/0257144 A1 | 10/2009 | Tamai et al. | |
| 2009/0311557 A1 | 12/2009 | Onoue et al. | |
| 2010/0119878 A1 | 5/2010 | Umezawa et al. | |
| 2010/0246060 A1 | 9/2010 | Sasaki | |
| 2011/0002064 A1 | 1/2011 | Nakagawa et al. | |
| 2011/0097600 A1 | 4/2011 | Onoue | |

FOREIGN PATENT DOCUMENTS

| | | |
|---|---|---|
| JP | 2005-276364 | 10/2005 |
| JP | 2007-87575 | 4/2007 |
| JP | 2009-48720 | 3/2009 |
| JP | 2009-238298 | 10/2009 |
| JP | 2009-252310 A2 | 10/2009 |
| JP | 2011-14191 A2 | 1/2011 |
| WO | WO 2007-114401 A1 | 11/2007 |
| WO | WO 2008-123446 | 10/2008 |
| WO | WO 2009-119708 A1 | 1/2009 |
| WO | WO 2009-044733 | 9/2009 |

* cited by examiner

MAGNETIC RECORDING MEDIUM, METHOD OF MANUFACTURING THE SAME, AND MAGNETIC RECORDING/REPRODUCTION APPARATUS

CROSS-REFERENCE TO RELATED APPLICATIONS

This application is a divisional of U.S. application Ser. No. 13/051,640, filed Mar. 18, 2011, which is based upon and claims the benefit of priority from Japanese Patent Application No. 2010-079075, filed Mar. 30, 2010; the entire contents of each of which are incorporated herein by reference.

FIELD

Embodiments described herein relate generally to a perpendicular magnetic recording medium for use in, e.g., a hard disk drive using the magnetic recording technique, and a magnetic recording/reproduction apparatus.

BACKGROUND

Magnetic memory devices (HDDs) mainly used in computers to record and reproduce information are recently beginning to be used in various applications because they have large capacities, inexpensiveness, high data access speeds, a high data retaining reliability, and the like, and they are now used in various fields such as household video decks, audio apparatuses, and automobile navigation systems. As the range of applications of the HDDs broadens, demands for large storage capacities increase, and high-density HDDs are more and more extensively developed in recent years.

As a magnetic recording method of presently commercially available HDDs, a so-called perpendicular magnetic recording method is recently most frequently used. In the perpendicular magnetic recording method, magnetic crystal grains forming a magnetic recording layer for recording information have the axis of easy magnetization in a direction perpendicular to a substrate. The axis of easy magnetization is an axis in the direction of which magnetization easily points. In a Co-based alloy, the axis of easy magnetization is the axis (c-axis) parallel to the normal to the (0001) plane of the hcp structure of Co. Even when the recording density is increased, therefore, the influence of a demagnetizing field between recording bits is small, and the medium is magnetostatically stable. A perpendicular magnetic recording medium generally includes a substrate, a soft magnetic underlayer for concentrating a magnetic flux generated from a magnetic head during recording, a nonmagnetic seed layer and/or nonmagnetic underlayer for orienting the magnetic crystal grains of a perpendicular magnetic recording layer in the (0001) plane and reducing the orientation dispersion, the perpendicular magnetic recording layer containing a hard magnetic material, and a protective layer for protecting the surface of the perpendicular magnetic recording layer. A film mainly used as the existing perpendicular magnetic recording layer is a multilayered film including a granular film type recording layer having a so-called granular structure in which magnetic crystal grains are surrounded by a grain boundary region made of a nonmagnetic material, and a continuous film type recording layer having a continuous-film-like structure not having a clear grain/grain boundary structure.

The granular film type recording layer has a structure in which magnetic crystal grains are two-dimensionally, physically isolated by a nonmagnetic grain boundary region, so the magnetic exchange interaction acting between the magnetic grains reduces. This makes it possible to reduce the transition noise of the recording/reproduction characteristics, and decrease the limit bit size. On the other hand, since the exchange interaction between the grains is reduced in the granular film type recording layer, the dispersion of a magnetization switching field (SFD) often increases in accordance with the composition of the grains and the dispersion of the grain diameter. This increases the transition noise or jitter noise of the recording/reproduction characteristics. Accordingly, it is impossible to obtain favorable recording/reproduction characteristics by using the granular film type recording layer alone.

By contrast, the continuous film type recording layer does not have a clear grain/grain boundary separated structure unlike the granular film type recording layer, so a relatively strong exchange interaction two-dimensionally, almost uniformly acts between magnetic crystal grains. When stacking this recording layer on the above-described granular film type recording layer, an exchange interaction with an appropriate magnitude can uniformly be exerted between the magnetic crystal grains in the granular film type recording layer through the continuous film type recording layer. This makes it possible to suppress the SFD described above, and remarkably improve the recording/reproduction characteristics when compared to those when using the granular film type recording layer alone. Note that this effect can be obtained only when the magnetic interaction is sufficiently acting between the granular film type recording layer crystal grains and continuous film type recording layer crystal grains, and no satisfactory effect is obtained if the interaction deteriorates as will be described later.

As described previously, the lower limit of the recording bit size strongly depends on the magnetic crystal grain diameter of the granular film type recording layer. To increase the recording density of the HDD, therefore, it is necessary to decrease the grain diameter of the granular film type recording layer. An example of methods reported as a method of decreasing the grain diameter of the granular film type recording layer is to decrease the grain diameter of an underlayer by, e.g., improving a seed layer or using a granular film as the underlayer, thereby decreasing the grain diameter of a granular film type recording layer to be stacked on the underlayer. Accordingly, the grain diameter of the granular film type recording layer can be decreased by using an underlayer having a small crystal grain diameter.

On the other hand, the present granular film type recording layer has a columnar structure in which one magnetic crystal grain epitaxially grows on one crystal grain of a nonmagnetic underlayer. However, the grain diameter of the magnetic crystal grains in the film plane is not constant in the direction of film thickness, but tends to decrease as the grains grow. The number of grains is constant in the direction of film thickness. On the surface of the granular film type recording layer, therefore, the area of the grain boundary region increases and the total area of the magnetic crystal grains decreases when compared to those in the initial growth portion. In other words, the packing ratio of the magnetic crystal grains decreases. In the granular film type recording layer in which the magnetic crystal grain diameter is decreased as described above, the grain packing ratio on the film surface significantly decreases from that of the conventional granular film type recording layer.

Accordingly, when stacking the continuous film type recording layer on the granular film type recording layer having the decreased magnetic crystal grain diameter, the contact area between the upper and lower magnetic crystal grains in the granular film type recording layer/continuous film type recording layer interface decreases, because the magnetic crystal grain packing ratio on the surface of the granular film type recording layer is very low. Consequently, the exchange interaction between the magnetic crystal grains in the two layers deteriorates, and the above-described magnetic characteristic adjusting function significantly degrades. This poses the problem that the recording/reproduction characteristics deteriorate because it is impossible to sufficiently suppress the SFD.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

DETAILED DESCRIPTION

Figure 1:
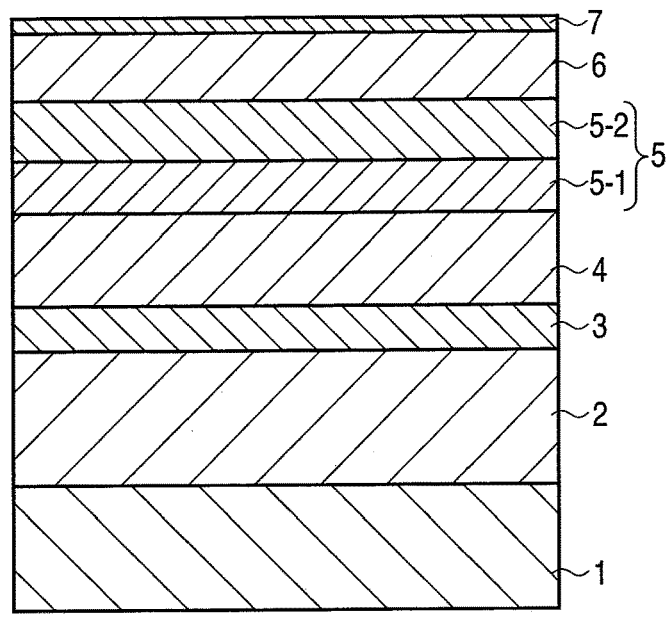
FIG. 1 is an exemplary view of the section of a magnetic recording medium according to a first embodiment.

Various embodiments will be described hereinafter with reference to the accompanying drawings.

In general, according to one embodiment, a perpendicular magnetic recording medium includes
a substrate,
a soft magnetic underlayer formed on the substrate,
a nonmagnetic seed layer formed on the soft magnetic underlayer,
at least one nonmagnetic underlayer formed on the nonmagnetic seed layer, and having an average grain diameter of 4 to 8 nm in a film plane, and
a perpendicular magnetic recording layer including a granular film type recording layer formed on the nonmagnetic underlayer and including magnetic crystal grains and a grain boundary region surrounding the magnetic crystal grains, and a continuous film type recording layer.

The granular film type recording layer includes a first granular film type recording layer in which magnetic crystal grains in a film plane has an average crystal grain diameter of 3 to 7 nm, and a second granular film type recording layer including magnetic crystal grains having an in-plane average crystal grain diameter larger than that of the magnetic crystal grains in the first granular film type recording layer.

A perpendicular magnetic recording medium manufacturing method according to another embodiment includes the steps of sequentially stacking a soft magnetic underlayer, nonmagnetic seed layer, nonmagnetic underlayer, and perpendicular magnetic recording layer on a substrate,
wherein the step of forming the perpendicular magnetic recording layer includes the step of forming a granular film type recording layer including magnetic crystal grains and a grain boundary region surrounding the magnetic crystal grains on the nonmagnetic underlayer, and thereafter forming a continuous film type recording layer, the nonmagnetic underlayer has an average grain diameter of 4 to 8 nm in a film plane, the granular film type recording layer includes two layers having different average grain diameters, and the step of forming the granular film type recording layer includes the step of forming, on the nonmagnetic underlayer, a first granular film type recording layer in which crystal grains in a film plane have an average crystal grain diameter of 3 to 7 nm, and the step of forming a second granular film type recording layer in which crystal grains in a film plane are larger than the average grain diameter of the crystal grains in the first granular film type recording layer, and a sputtering target containing an Si oxide, Co oxide, and CoCrPt alloy is used in the step of forming the first granular film type recording layer.

In the step of forming the second granular film type recording layer, it is also possible to perform sputtering by using a sputtering target containing Si oxide, Co oxide, and a CoCrPt alloy. The CoO content in the sputtering target of the second granular film type recording layer can be smaller than that in the sputtering target of the first granular film type recording layer. The sputtering targets to be used for the first and second granular film type recording layers can further contain Cr oxide as needed.

A magnetic recording/reproduction apparatus according to an embodiment is characterized by including the above-described magnetic recording medium and a recording/ reproduction head.

The first granular film type recording layer is close to the underlayer, and will be referred to as a small-grain-diameter magnetic layer hereinafter. The second granular film type recording layer is close to the continuous film type recording layer, and will be referred to as a grain diameter modulating magnetic layer hereinafter.

FIG. 1 is a sectional view showing an example of the magnetic recording medium according to the embodiment.

As shown in FIG. 1, a magnetic recording medium 10 has a structure in which a soft magnetic underlayer 2, nonmagnetic seed layer 3, nonmagnetic underlayer 4, granular film type recording layer 5, continuous film type recording layer 6, and protective layer 7 are sequentially stacked on a substrate 1. The granular film type recording layer 5 includes two layers, i.e., a small-grain-diameter magnetic layer 5-1 and grain diameter modulating magnetic layer 5-2.

Film Configuration of Magnetic Recording Medium According to Embodiment

As a nonmagnetic substrate of the perpendicular magnetic recording medium according to the embodiment, it is possible to use, e.g., a glass substrate, an Al-based alloy substrate, an Si single-crystal substrate having an oxidized surface, ceramics, or plastic. In addition, the same effect is expected even when the surface of any of these nonmagnetic substrates is plated with an NiP alloy or the like.

In the perpendicular magnetic recording medium according to the embodiment, a high-permeability soft magnetic underlayer is formed on the substrate. The soft magnetic underlayer horizontally passes a recording magnetic field from a magnetic head such as a single pole head for magnetizing the perpendicular magnetic recording layer, and returns the recording magnetic field to the magnetic head, thereby performing a part of the function of the magnetic head. Thus, the soft magnetic underlayer can increase the recording/reproduction efficiency by applying a steep sufficient perpendicular magnetic field to the magnetic field recording layer.

Examples of the soft magnetic layer as described above are CoZrNb, CoB, CoTaZr, FeSiAl, FeTaC, CoTaC, NiFe, Fe, FeCoB, FeCoN, and FeTaN.

The soft magnetic underlayer can also be a multilayered film including two or more layers. In this case, the materials, compositions, and film thicknesses of the individual layers may be different. It is also possible to form a triple-layered structure by sandwiching a thin Ru layer between two soft magnetic underlayers.

To improve the mechanical adhesion between the substrate and soft magnetic underlayer, a nonmagnetic adhesion layer may be formed between the substrate and soft magnetic layer. Examples of the nonmagnetic adhesion layer are materials such as Cr and Ti, and alloys of these materials.

In the perpendicular magnetic recording medium according to the embodiment, the nonmagnetic seed layer is formed on the soft magnetic underlayer. The nonmagnetic seed layer has a function of controlling the crystal orientation and crystal grain diameter of the nonmagnetic underlayer formed on the nonmagnetic seed layer. Examples of the nonmagnetic seed layer are materials such as Si, Al—Si, Ru—Si, and Pd—Si, and multilayered structures such as Si/Pd, Al—Si/Pd, Ru—Si/Pd, Pd—Si/Pd, Si/Pt, Al—Si/Pt, Ru—Si/Pt, and Pd—Si/Pt obtained by stacking Pd and Pt on these materials. When using any of these multilayered structures, the grain diameter of the nonmagnetic underlayer can be controlled by changing the film thickness of Pd or Pt. It is also possible to use a material obtained by forming a thin nitrogen deposition layer on a Cu surface. The use of any of these materials makes it possible to improve the crystal orientation of the nonmagnetic underlayer, and decrease the nonmagnetic underlayer grain diameter. The nonmagnetic seed layer may be crystalline or amorphous. The nonmagnetic seed layer may have a multilayered structure including two or more layers.

The nonmagnetic underlayer has a function of controlling the crystal orientation and crystal grain diameter of the granular film type recording layer formed on the nonmagnetic underlayer. In the perpendicular magnetic recording medium according to the embodiment, the above-described seed layer makes the average grain diameter of crystal grains in the nonmagnetic underlayer fall within the range of 4 to 8 nm. The average grain diameter herein mentioned is the average crystal grain diameter in a plane near the center of the film thickness (the same shall apply hereinafter). The average grain diameter of the granular film type recording layer can be decreased by using the nonmagnetic underlayer having a small average grain diameter as described above. If the average grain diameter of the crystal grains in the nonmagnetic underlayer is less than 4 nm, the crystal orientation of the nonmagnetic underlayer deteriorates. If this average grain diameter exceeds 8 nm, the crystal grain diameter of the granular film type recording layer tends to increase. Furthermore, the average grain diameter of the crystal grains in the nonmagnetic underlayer can be set within the range of 5 to 7 nm. As the material of the nonmagnetic underlayer, it is possible to use a metal or alloy material having a (0001)-oriented hcp structure. More specifically, it is possible to use Ru, an Ru alloy, or Co alloy. The crystal orientation of the granular film type recording layer can be improved by using any of these materials. The nonmagnetic underlayer can also have a granular structure including nonmagnetic crystal grains and a nonmagnetic grain boundary region. The nonmagnetic underlayer can further have a multilayered structure including two or more layers.

On the other hand, an example of a method of decreasing only the granular film type recording layer grain diameter without decreasing the nonmagnetic underlayer grain diameter as described above is a method of depositing the granular film type recording layer by adding oxygen to a sputtering gas. Unfortunately, this method often decreases the c-axis orientation dispersion of the granular film type recording layer, thereby deteriorating the magnetic characteristics and recording/reproduction characteristics.

The magnetic recording layer of the perpendicular magnetic recording medium according to the embodiment has a multilayered structure including the granular film type recording layer and continuous film type recording layer.

The continuous film type recording layer is used to improve the magnetic characteristics. The continuous film type recording layer herein mentioned is a recording layer that does not have any clear grain/grain boundary structure such as a granular structure but has a continuous-film-like structure. In a magnetic layer having this continuous-film-like structure, the exchange interaction between magnetic crystal grains acts more strongly than that in the granular film type recording layer. By stacking this recording layer on the granular film type recording layer, it is possible to appropriately and uniformly adjust the exchange interaction between magnetic grains in the granular film type recording layer. This makes it possible to suppress the SFD of each magnetic grain of the granular film type recording layer, and reduce the jitter noise of the recording/reproduction characteristics. As the continuous film type recording layer, it is possible to use an alloy material such as a CoCrPt alloy or CoCrPtB alloy, or an artificial lattice film such as Co/Pt or Co/Pd.

The granular film type recording layer is used to reduce the bit size of the recording/reproduction characteristics. The granular film type recording layer herein mentioned is a layer having a granular structure in which a nonmagnetic grain boundary region two-dimensionally surrounds individual magnetic crystal grains in the film plane. In the granular film type recording layer, the individual magnetic crystal grains are physically isolated by the nonmagnetic grain boundary region. This makes it possible to reduce the exchange interaction between the magnetic grains, and reduce the transition noise of the recording/reproduction characteristics.

As the magnetic crystal grain material of the granular film type recording layer of the perpendicular magnetic recording medium according to the embodiment, it is possible to use an alloy material having the hcp structure practically oriented in the (0001) plane and containing Co and Pt. When Co alloy crystal grains having the hcp structure are oriented in the (0001) plane, the axis of easy magnetization is oriented perpendicularly to the substrate surface, thereby achieving perpendicular magnetic anisotropy. This is favorable for the perpendicular magnetic recording medium. It is also possible to use, e.g., a Co—Pt-based alloy material or Co—Pt—Cr-based alloy material. These alloys have a high magnetocrystalline anisotropic energy and hence have a high thermal decay resistance. To improve the magnetic characteristics, additive elements such as Ta, Cu, B, and Nd may be added to these alloy materials as needed.

An oxide of, e.g., Si, Cr, or Ti can be used as the nonmagnetic grain boundary region material of the granular film type recording layer of the perpendicular magnetic recording medium according to the embodiment. These oxides hardly form a solid solution with the Co—Pt alloy described above, and readily deposit in the crystal grain boundary between the magnetic crystal grains. Therefore, a granular structure can be obtained relatively easily. The material forming the grain boundary region may be crystalline or amorphous.

The total ratio of the substance amounts of the material forming the grain boundary region to the alloy forming the magnetic crystal grains can be 5 to 15 mol %. If this ratio is less than 5 mol %, the granular structure becomes difficult to maintain. If the ratio exceeds 20 mol %, the reproduction output of the R/W characteristics often decreases. The ratio can also be 7 to 12 mol %.

The granular film type recording layer of the perpendicular magnetic recording medium according to the embodiment has a multilayered structure including two layers having different average grain diameters, and the average grain diameter of the layer close to the continuous film type recording layer is larger than that of the layer close to the nonmagnetic underlayer.

In the granular film type recording layer, the individual magnetic crystal grains epitaxially grow into columns on the nonmagnetic underlayer crystal grains, but the grain boundary substance in the nonmagnetic grain boundary region prevents the grain growth in the direction of the film plane. When forming the granular film type recording layer on the nonmagnetic underlayer material, therefore, the crystal grain diameter of the nonmagnetic underlayer is generally reflected on that of the granular film type recording layer, so fine magnetic crystal grains can be obtained. On the other hand, the columnar crystal grains in the granular film type recording layer as described above grow such that the crystal grain diameter is not constant in the direction of the film thickness: as the film thickness increases, the average grain diameter on the side close to the surface decreases, and the area of the grain boundary region increases. That is, the grain packing ratio on the surface side often decreases compared to that in the initial growth portion. When decreasing the average grain diameter by decreasing the underlayer grain diameter, the grain packing ratio in the surface region significantly decreases with respect to the granular film type recording layer having the conventional grain diameter and grain boundary width. Therefore, the contact area between the magnetic crystal grains in the upper and lower layers noticeably decreases in the interface with the continuous film type recording layer. Consequently, the exchange interaction acting between the granular film type recording layer and continuous film type recording layer deteriorates. This degrades the SFD reducing effect obtained by stacking the continuous film type recording layer as described previously. The granular film type recording layer of the perpendicular magnetic recording medium according to the embodiment has the multilayered structure including two layers having different average grain diameters, and the average grain diameter of the layer close to the continuous film type recording layer is larger than that of the layer close to the nonmagnetic underlayer. Accordingly, the exchange interaction acting between the granular film type recording layer and continuous film type recording layer does not deteriorate, and the SFD can effectively be reduced.

In the perpendicular magnetic recording medium according to the embodiment, the average grain diameter of the magnetic crystal grains in the small-grain-diameter magnetic layer can be 3 to 7 nm. If the average grain diameter of the magnetic crystal grains is less than 3 nm, the recording magnetization of each magnetic crystal grain becomes unstable due to thermal energy. If the average grain diameter exceeds 7 nm, the transition noise of the recording/reproduction characteristics tends to increase. The average grain diameter of the magnetic crystal grains can also be 4 to 6 nm.

On the other hand, the average grain diameter of the magnetic crystal grains in the grain diameter modulating magnetic layer of the perpendicular magnetic recording medium according to the embodiment can be 7 to 10 nm. If the average grain diameter of the magnetic crystal grains is less than 7 nm, the exchange interaction acting between this layer and the continuous film type recording layer deteriorates. If the average grain diameter exceeds 10 nm, the transition noise reducing effect obtained by the small-grain-diameter magnetic layer does not remarkably appear any longer. The average grain diameter of the magnetic crystal grains in the grain diameter modulating magnetic layer can also be 8 to 9 nm.

An example of a method by which the grain diameter of the grain diameter modulating magnetic layer stacked on the small-grain-diameter magnetic layer is made larger than that of the small-grain-diameter magnetic layer is a method of increasing the content of the magnetic crystal grain alloy in the grain diameter modulating magnetic layer relative to the grain boundary region substance. It is also possible to adjust the deposition conditions, e.g., the sputtering gas pressure of sputtering deposition, and the input power to a target.

In the perpendicular magnetic recording medium according to the embodiment, the grain packing ratio in the film plane of the small-grain-diameter magnetic layer can be 50% to 70%. The grain packing ratio herein mentioned is the area packing ratio of crystal grains in the film plane, and defined by (Sum of areas of crystal grains)/{(sum of areas of crystal grains)+(total area of grain boundary region)}

In the granular film type recording layer as described previously, the individual magnetic crystal grains are physically isolated by the nonmagnetic grain boundary region, and this reduces the exchange interaction between the magnetic grains. Therefore, the exchange interaction can further be reduced by appropriately increasing the area of the nonmagnetic grain boundary region, and increasing the physical distance between the magnetic crystal grains, i.e., appropriately decreasing the grain packing ratio. This makes it possible to further reduce the transition noise of the recording/reproduction characteristics. The present inventors made extensive studies, and have found that the grain packing ratio of the small-grain-diameter magnetic layer can be set within the range of 50% to 70%. If the grain packing ratio exceeds 70%, the exchange interaction between the magnetic crystal grains increases, and the recording/reproduction characteristics often deteriorate. If the grain packing ratio is less than 50%, the recording magnetization amount per unit area reduces, and the reproduction signal intensity of the recording/reproduction characteristics tends to significantly decrease. The grain packing ratio in the small-grain-diameter magnetic layer can further be set within the range of 60% to 65%.

In the perpendicular magnetic recording medium according to the embodiment, the grain packing ratio in the film plane of the grain diameter modulating magnetic layer can be made larger than that of the small-grain-diameter magnetic layer described above. By making the grain packing ratio of the grain diameter modulating magnetic layer larger than that of the small-grain-diameter magnetic layer, it is possible to increase the contact area between the continuous film type recording layer and magnetic crystal grains, and increase the exchange interaction acting between the two layers. More specifically, the grain packing ratio can be set within the range of 70% to 90%. If the grain packing ratio is less than 70%, the exchange interaction acting between the grain diameter modulating magnetic layer and continuous film type recording layer often deteriorates. If the grain packing ratio exceeds 90%, the transition noise reducing effect obtained by the small-grain-diameter magnetic layer tends to insignificantly appear. It is also found by experiments that the grain packing ratio of the grain diameter modulating magnetic layer can be set within the range of 80% to 85%.

In the perpendicular magnetic recording medium according to the embodiment, at least Si oxide and Cr oxide are contained as the grain boundary substance of the small-grain-diameter magnetic layer, and the Cr oxide content in the small-grain-diameter magnetic layer can be made higher than that in the grain diameter modulating magnetic layer. The grain packing ratio of the magnetic crystal grains in the granular film type recording layer can be decreased to some extent by increasing the content of the grain boundary region substance relative to the magnetic crystal grain alloy. The present inventors made extensive studies, and have found that the grain packing ratio is effectively decreased by increasing the Cr oxide content as the grain boundary substance. The above-described grain packing ratio is obtained by making the Cr oxide content in the small-grain-diameter magnetic layer higher than that in the grain diameter modulating magnetic layer. Note that the grain diameter modulating magnetic layer need not always contain any Cr oxide.

Figure 2:
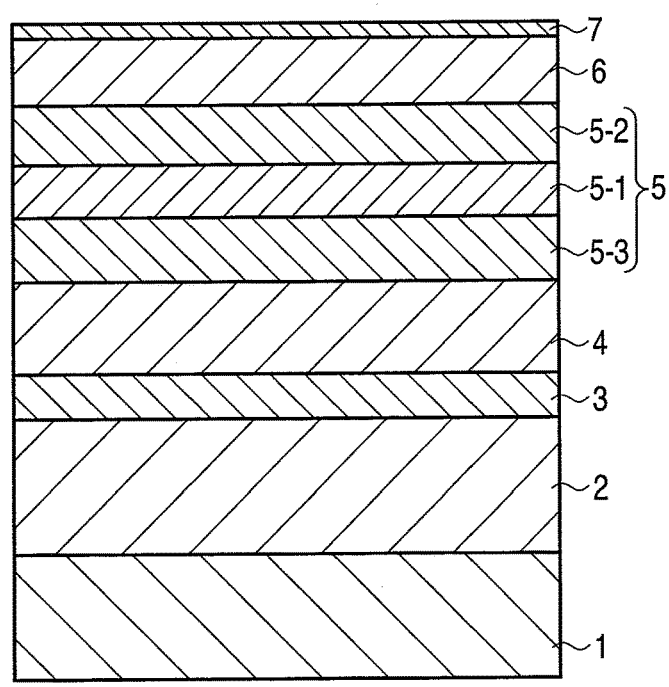
FIG. 2 is an exemplary view of the section of a magnetic recording medium according to a second embodiment.

FIG. 2 is a sectional view showing another example of the magnetic recording medium according to the embodiment.

As shown in FIG. 2, a magnetic recording medium 20 has a structure in which a soft magnetic underlayer 2, nonmagnetic seed layer 3, nonmagnetic underlayer 4, granular film type recording layer 5, continuous film type recording layer 6, and protective layer 7 are sequentially stacked on a substrate 1. The granular film type recording layer 5 includes three layers, i.e., a small-grain-diameter magnetic layer 5-3, small-grain-diameter magnetic layer 5-1, and non-small-grain-diameter magnetic layer 5-2.

In the perpendicular magnetic recording medium according to the embodiment, the small-grain-diameter magnetic layer includes two layers different in Cr content of magnetic crystal grains, and the Cr content of the magnetic crystal grains in the layer (lower layer) close to the nonmagnetic underlayer can be made lower than that of the magnetic crystal grains in the layer (upper layer) close to the grain diameter modulating magnetic layer.

In the initial growth portion (near the interface with the nonmagnetic underlayer) of the granular magnetic layer, the interaction between the magnetic crystal grains generally tends to increase although the granular structure is formed. This poses the problem that the transition noise of the recording/reproduction characteristics increases. Although the cause of the increase in interaction in the initial growth portion is unclear, the presence/absence of a stacking defect of a CoCrPt magnetic crystal grain alloy in the initial growth portion may be a cause. The present inventors made extensive studies, and have found that the increase in interaction in the initial growth portion is suppressed by decreasing the Cr content of the small-grain-diameter magnetic layer. This is so probably because the stacking defect amount of CoCrPt is reduced by decreasing the Cr content. On the other hand, since Cr has an effect of facilitating the formation of a granular structure, the inter-grain interaction often reduces as the Cr content increases in portions other than the initial growth portion. The present inventors made extensive studies based on these facts, and have found that when the small-grain-diameter magnetic layer is divided into two layers and the Cr content of the magnetic crystal grains in the layer (lower layer) close to the nonmagnetic underlayer is made lower than that of the magnetic crystal grains in the layer (upper layer) close to the grain diameter modulating magnetic layer, it is possible to reduce the interaction in the initial growth portion and the interaction in a medium-thickness portion or on the surface side at the same time, and as a consequence the interaction reducing effect is high.

More specifically, the SNR of the recording/reproduction characteristics can increase when the Cr content in the magnetic crystal alloy of the lower layer is 0 to 12 atomic %, and that in the magnetic crystal alloy of the upper layer is 12 to 18 atomic %. It is found by experiments that the SNR of the recording/reproduction characteristics can further increase when the Cr content in the magnetic crystal alloy of the lower layer is 8 to 10 atomic %, and that in the magnetic crystal alloy of the upper layer is 14 to 17 atomic %.

A nonmagnetic interlayer may be formed between the granular film type recording layer and continuous film type recording layer in order to adjust the exchange interaction acting between the two layers, thereby obtaining a so-called ECC media (Exchange Coupled Composite media) configuration. More specifically, it is possible to use a material such as Ru, Pd, Pt, or Ir, or an alloy of any of these materials. The nonmagnetic interlayer may have a granular structure.

A protective layer can be formed on the perpendicular magnetic recording medium. Examples of the protective layer are C, diamond-like carbon (DLC), $SiN_X$, $SiO_X$, and $CN_X$.

According to the embodiment, a magnetic recording medium capable of high-density information recording and reproduction is obtained by decreasing the grain diameter of the perpendicular magnetic recording medium and suppressing the dispersion of a magnetization reversal field at the same time.

Evaluation Methods

The average grain diameter of crystal grains in each layer can be confirmed by observing the plane of a main recording layer by using, e.g., a transmission electron microscope (TEM). The crystal grain packing ratio of each layer can also be evaluated by the same method. When using energy dispersive X-ray analysis (EDX) in addition to the above method, it is possible to identify the elements of the crystal grain and grain boundary region, and evaluate their contents.

It is possible to identify the oxide of each layer and evaluate the content of the oxide by X-ray photoelectron spectroscopy (XPS).

The orientation plane of crystal grains in each layer can be evaluated by the θ-2θ method by using, e.g., a general X-ray diffractometer (XRD). The orientation dispersion can be evaluated by a half-width Δθ50 of a rocking curve.

Manufacturing Methods

As the deposition method of each layer, it is possible to use any of vacuum deposition, various sputtering methods, molecular beam epitaxy, ion beam deposition, laser abrasion, and chemical vapor deposition.

Sputtering can be used as a method of depositing the granular film type recording layer of the perpendicular magnetic recording medium according to the embodiment. As described earlier, the magnetic crystal grain diameter and grain packing ratio can be controlled relatively easily when using sputtering.

Especially when depositing the small-grain-diameter magnetic layer by sputtering, the pressure can be a high pressure of 2 Pa or more. If the pressure of sputtering deposition is low, the grain diameter often increases to destroy the granular structure. Deposition can be performed within the range of 3 to 6 Pa.

The small-grain-diameter magnetic layer can be deposited by sputtering using a target containing a Co oxide. As described previously, it is effective to increase the Cr oxide content in the grain boundary region of the small-grain-diameter magnetic layer, as the method of decreasing the grain packing ratio of the small-grain-diameter magnetic layer. An example of the method of increasing the Cr oxide content in the small-grain-diameter magnetic layer is to increase the Cr oxide content in the target. On the other hand, the present inventors made extensive studies, and have found that a target containing Co oxide can be used. CoO as Co oxide is chemically unstable at room temperature when compared to $Cr_2O_3$ as Cr oxide, so Cr is often oxidized by CoO. When performing sputtering deposition by using a target containing CoO and Cr, Cr is oxidized by CoO and readily deposited in the grain boundary region. This increases the area of the grain boundary region, and further decreases the grain packing ratio. On the other hand, CoO is almost completely reduced during the deposition process, and forms a solid solution, as metal Co, in the magnetic crystal grain alloy. It is found by extensive studies made by the present inventors that the grain packing ratio reducing effect obtained by adding CoO to the target is larger than that when Cr oxide is added to the target. More specifically, it is possible to further decrease the grain packing ratio of the small-grain-diameter magnetic layer by using a (CoCrPt)—$SiO_2$—$Cr_2O_3$—CoO material mixture as the target. Note that CoO added to the target causes a redox reaction with Cr or the like during the deposition process as described above, so the target composition does not necessarily match the actual granular film composition.

It is found by experiments that the CoO content in the target can be set within the range of 0.5 to 12 mol %, and can also be set within the range of 6 to 10 mol %.

On the other hand, as the method of depositing the grain diameter modulating magnetic layer, a layer having a grain packing ratio higher than that of the small-grain-diameter magnetic layer can be obtained relatively easily by using a target containing a CoO content lower than that in the target for depositing the small-grain-diameter magnetic layer.

Figure 3:
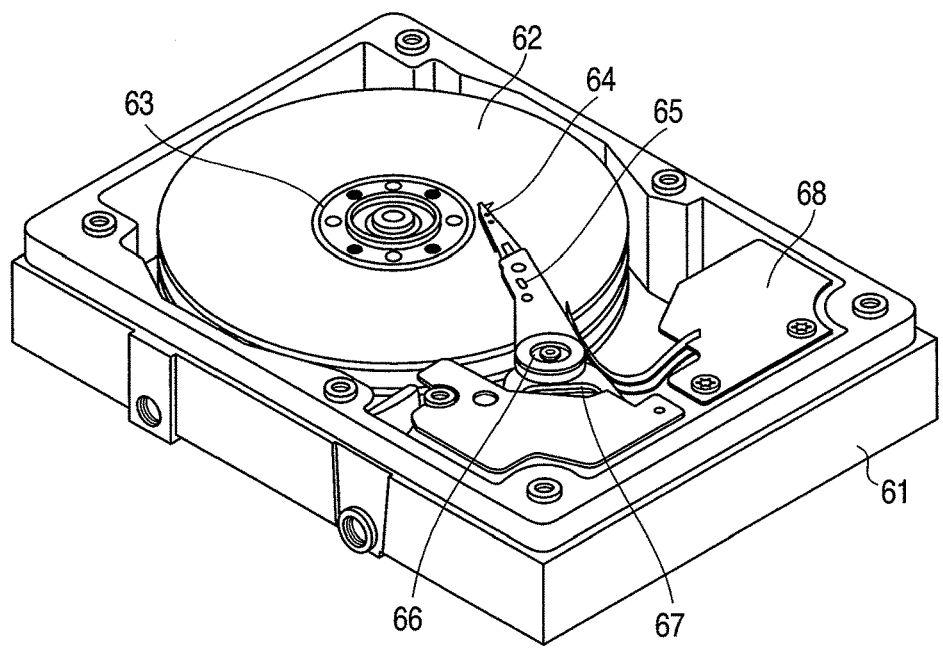
FIG. 3 is an exemplary view of a magnetic recording/ reproduction apparatus according to one embodiment.

It is possible to identify CoO in a target and evaluate the content of CoO by dissolving a target piece with an acid or the like and analyzing the solution by using inductively coupled plasma atomic emission spectroscopy (ICP-AES). Drive FIG. 3 is a partially exploded perspective view of an example of the magnetic recording/reproduction apparatus according to the embodiment.

A rigid magnetic disk 62 for information recording according to the embodiment is mounted on a spindle 63, and rotated at a predetermined rotational speed by a spindle motor (not shown). A slider 64 carrying a recording head for recording information by accessing the magnetic disk 62 and an MR head for reproducing information is attached to the distal end of a suspension made of a thin leaf spring. This suspension is connected to one end of an arm 65 including, e.g., a bobbin for holding a driving coil (not shown).

A voice coil motor 67 as a kind of a linear motor is formed at the other end of the arm 65. The voice coil motor 67 includes a driving coil (not shown) wound on the bobbin of the arm 65, and a magnetic circuit including a permanent magnet and counter yoke facing each other to sandwich the driving coil between them.

The arm 65 is held by ball bearings (not shown) formed in two, upper and lower portions of a fixing shaft 66, and swung by the voice coil motor 67. That is, the voice coil motor 67 controls the position of the slider 64 on the magnetic disk 62. Note that reference numeral 68 in FIG. 3 denotes a lid.

The present invention will be explained in more detail below by way of its examples.

Example 1

A 2.5-inch hard disk type nonmagnetic glass substrate (MEL5 manufactured by Konica Minolta Opt) was loaded into a vacuum chamber of the c-3010 sputtering apparatus manufactured by Canon ANELVA.

After the vacuum chamber of the sputtering apparatus was evacuated to $1 \times 10^{-5}$ Pa or less, Co—Zr—Nb (50 nm) as a soft magnetic underlayer, an Al-44atomic % Si (5 nm)/Pd multilayered film as a nonmagnetic seed layer, Ru (20 nm) as a nonmagnetic underlayer, (Co—Cr—Pt)—$SiO_2$ (14 nm) as a granular film type recording layer, Co—Cr—Pt (6 nm) as a continuous film type recording layer, and C (5 nm) as a protective layer were sequentially deposited on a substrate. After the deposition, the surface of the protective layer was coated with a 13-Å thick perfluoropolyether (PFPE) lubricant by dipping, thereby obtaining each perpendicular magnetic recording medium. Atomic % will be represented by at % as needed hereinafter.

Each layer was deposited by DC sputtering. The deposition conditions were that the diameter of each target was 164 mm, the T-S distance was 50 mm, the input power was 500 W, and the temperature was room temperature.

The soft magnetic underlayer was deposited at an Ar pressure of 0.5 Pa by using a $Co_{90}Zr_5Nb_5$ target. The nonmagnetic seed layer was deposited at an Ar pressure of 0.5 Pa by using an Al-44 at % Si target and Pd target. The aluminum silicon/Pd film thickness was changed from 2 to 8 nm (Examples 1-1 to 1-4 and Comparative Examples 6 and 7).

The nonmagnetic underlayer was deposited at 6 Pa by using Ru target.

The granular film type recording layer had a double-layered structure including a small-grain-diameter magnetic layer and grain diameter modulating magnetic layer. That is, 12-nm thick ($Co_{68}$—$Cr_{16}$—$Pt_{16}$)-10 mol % $SiO_2$ was deposited at 5 Pa, and 2-nm thick ($Co_{68}$—$Cr_{16}$—$Pt_{16}$)-5.5 mol % $SiO_2$ was deposited at 2 Pa. A 6-nm thick ($Co_{71}$—$Cr_{19}$—$Pt_{10}$) film was deposited at 0.5 Pa as the continuous film type recording layer. 5-nm thick C was deposited at 0.5 Pa as the protective layer.

Comparative Example 1

As a comparative example, the conventional perpendicular magnetic recording medium was manufactured as follows.

That is, the medium was manufactured following the same procedures as in Example 1 except that the nonmagnetic seed layer was 6-nm thick Pd and no grain diameter modulating magnetic layer was formed.

Comparative Example 2

As a comparative example, a magnetic recording medium having no grain diameter modulating magnetic layer was manufactured as follows.

That is, the medium was manufactured following the same procedures as in Example 1 except that the nonmagnetic seed layer was Al-44 at % Si (5 nm)/Pd (4 nm) and no grain diameter modulating magnetic layer was formed.

Comparative Example 3

As a comparative example, a magnetic recording medium in which the nonmagnetic underlayer grain diameter was the same as that of the conventional perpendicular magnetic recording medium and only the granular film type recording layer grain diameter was decreased was manufactured as follows.

That is, the medium was manufactured following the same procedures as in Example 1 except that the nonmagnetic seed layer was 6-nm thick Pd and an Ar-10vol. % $O_2$ gas mixture was used as a sputtering gas when depositing the small-grain-diameter magnetic layer.

Comparative Example 4

As a comparative example, a magnetic recording medium having no granular film type recording layer was manufactured as follows.

That is, the medium was manufactured following the same procedures as in Example 1 except that the nonmagnetic seed layer was Al-44 at % Si (5 nm)/Pd (4 nm) and no granular film type recording layer was formed.

Comparative Example 5

As a comparative example, a magnetic recording medium in which the stacking positions of the small-grain-diameter magnetic layer and grain diameter modulating magnetic layer were switched was manufactured as follows.

That is, the medium was manufactured following the same procedures as in Example 1 except that the nonmagnetic seed layer was Al-44 at % Si (5 nm)/Pd (4 nm) and the stacking positions of the small-grain-diameter magnetic layer and grain diameter modulating magnetic layer were switched.

The R/W characteristics of each perpendicular magnetic recording medium were evaluated by using a spinstand. As a magnetic head, a combination of a single pole head having a recording track width of 0.3 µm and an MR head having a reproduction track width of 0.2 µm was used.

The measurements were performed in a predetermined radial position of 20 mm while the disk was rotated at 4,200 rpm.

As the medium SNR, the value of a signal-to-noise ratio (SNRm) (S is the output at a liner recording density of 119 kfci, and Nm is the value of rms (root mean square) at 716 kfci) of a differential waveform passed through a differentiating circuit was evaluated.

The fine structure of each layer of each perpendicular magnetic recording medium was evaluated by using a TEM having an acceleration voltage of 400 kV.

The compositions of the crystal grains and grain boundary region of each layer of each perpendicular magnetic recording medium were evaluated by using TEM-EDX and XPS.

The SFD of each magnetic recording medium was evaluated by the $\Delta Hc/Hc$ method using a polar Kerr effect measuring device.

Figure 4:
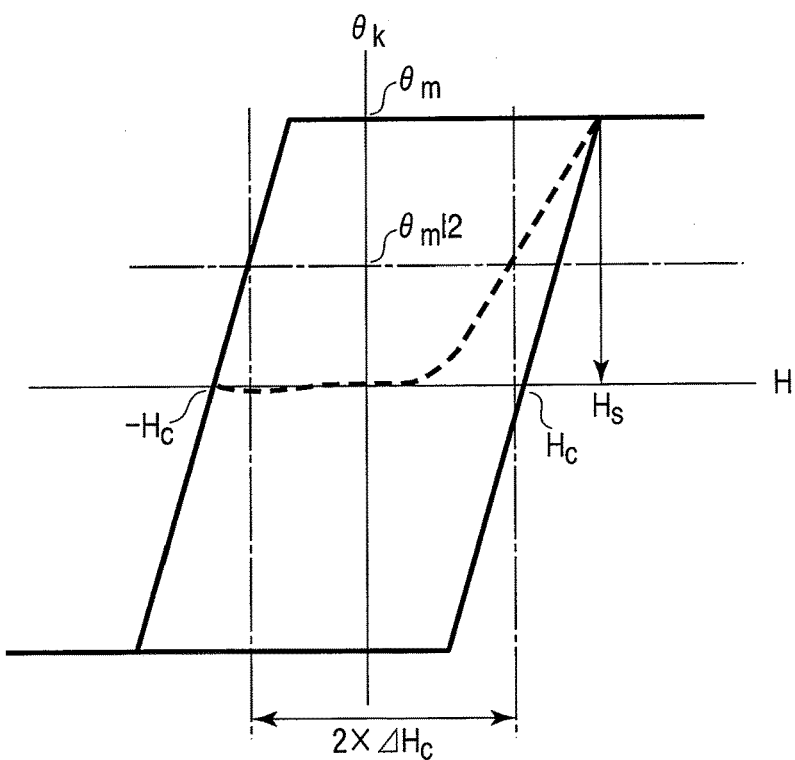
FIG. 4 is a graph for explaining the ΔHc and a method of evaluating the same.

FIG. 4 shows a hysteresis loop for explaining the $\Delta Hc$ and its evaluation method.

That is, after the hysteresis loop (thick solid line) was obtained under the conditions that the maximum applied magnetic field was 20 kOe and the magnetic field sweep rate was 133 Oe/s, the applied magnetic field was turned to Hs from the point of −Hc on the hysteresis loop, thereby obtaining a minor loop (thick dotted line). The difference between a magnetic field of $\theta s/2$ on the minor loop and a magnetic field in the second quadrant of the hysteresis loop was regarded as $2\Delta Hc$, and the $\Delta Hc/Hc$ was obtained by normalization by Hc.

Table 1 below shows the value of $\Delta Hc/Hc$ of each magnetic recording medium.

The composition of each target was evaluated by using inductively coupled plasma atomic emission spectroscopy (ICP-AES).

The crystal structure and crystal plane orientation of each perpendicular magnetic recording medium were evaluated by the $\theta$-$2\theta$ method and rocking curve by generating a Cu—K$\alpha$ line at an acceleration voltage of 45 kV and a filament current of 40 mA by using the X'pert-MRD X-ray diffraction apparatus manufactured by Philips.

Table 1 below shows the c-axis orientation dispersion $\Delta\theta 50$ of the small-grain-diameter magnetic layer of each magnetic recording medium.

The results of the XRD evaluation show that the magnetic crystal grains in the granular film type recording layer of every perpendicular magnetic recording medium had the hcp structure and were oriented in the (0001) plane.

Also, the magnetic crystal grains in the continuous film type recording layer of every perpendicular magnetic recording medium had the hcp structure and were oriented in the (0001) plane.

Ru of the nonmagnetic underlayer of every medium had the hcp structure and was oriented in the (0001) plane.

The results of the planar TEM observation indicate that the granular film type recording layer of every perpendicular magnetic recording medium had a granular structure in which the grain boundary region surrounded the magnetic crystal grains.

The results of the composition analysis by TEM-EDX demonstrate that the magnetic crystal grains in the granular film type recording layer of every perpendicular magnetic recording medium contained Co, Pt, and Cr.

Furthermore, the continuous film type recording layer of every perpendicular magnetic recording medium had a continuous film structure because no clear grain/grain boundary structure could be confirmed. The results of the composition analysis by TEM-EDX demonstrate that the continuous film type recording layer of every perpendicular magnetic recording medium contained Co, Pt, and Cr.

Table 1 below shows an average grain diameter d(Ru) of the nonmagnetic underlayer, an average grain diameter d(gra) of the small-grain-diameter magnetic layer, and an average grain diameter d(mod) of the grain diameter modulating magnetic layer of each medium. The average grain diameter of each layer was evaluated in the center of the film thickness of the layer.

Comparison of Example 1 with Comparative Examples 6 and 7 reveals that the $\Delta Hc/Hc$ and SNR remarkably improved and favorable characteristics were obtained when the average grain diameter of the nonmagnetic underlayer was 4 to 8 nm and that of the small-grain-diameter magnetic layer was 3 to 7 nm. This comparison also shows that the $\Delta Hc/Hc$ and SNR further improved when the average grain diameter of the nonmagnetic underlayer was 5 to 7 nm and that of the small-grain-diameter magnetic layer was 4 to 6 nm.

Comparative Example 1 shows that the SNR noticeably improved compared to that of the conventional perpendicular magnetic recording medium when the average grain diameter of the nonmagnetic underlayer was 4 to 8 nm and that of the small-grain-diameter magnetic layer was 3 to 7 nm in the magnetic recording medium of Example 1. On the other hand, there was no significant difference in ΔHc/Hc. Therefore, the SNR of the magnetic recording medium of Example 1 improved presumably mainly because it was possible to suppress the increase in ΔHc/Hc while decreasing the average grain diameter of the granular recording layer.

Comparison with Comparative Example 2 reveals that when the average grain diameter of the nonmagnetic underlayer was 4 to 8 nm and that of the small-grain-diameter magnetic layer was 3 to 7 nm in the magnetic recording medium of Example 1, the SNR and ΔHc/Hc markedly improved by forming the grain diameter modulating magnetic layer having an average grain diameter larger than that of the small-grain-diameter magnetic layer. Accordingly, the SNR of the magnetic recording medium of Example 1 improved probably mainly because the grain diameter modulating magnetic layer having a large average grain diameter reduced the ΔHc/Hc.

Comparison with Comparative Example 3 demonstrates that when the crystal grain diameter of the nonmagnetic underlayer was not decreased and only the grain diameter of the small-grain-diameter magnetic layer was decreased, the c-axis orientation dispersion of the small-grain-diameter magnetic layer increased, and the SNR deteriorated. Accordingly, the SNR of the magnetic recording medium of Example 1 improved probably principally because it was possible to suppress the increase in c-axis orientation dispersion by decreasing the average grain diameter of the small-grain-diameter magnetic layer by using the nonmagnetic underlayer having a small average grain diameter.

Comparison with Comparative Example 4 shows that the SNR deteriorated when there was no granular film type recording layer.

Comparison with Comparative Example 5 indicates that the SFD and SNR deteriorated when the small-grain-diameter magnetic layer was stacked on the grain diameter modulating magnetic layer. Therefore, the SNR of the magnetic recording medium of Example 1 improved perhaps primarily because the bit diameter was decreased by the small-grain-diameter magnetic layer having a small average grain diameter, and the ΔHc/Hc was reduced by forming the grain diameter modulating magnetic layer having a large average grain diameter on the small-grain-diameter magnetic layer.

The above results demonstrate that when the average grain diameter of the nonmagnetic underlayer was 4 to 8 nm and that of the small-grain-diameter magnetic layer was 3 to 7 nm, it was presumably possible, by forming the grain diameter modulating magnetic layer having an average grain diameter larger than that of the small-grain-diameter magnetic layer, to decrease the bit size and improve the SNR while suppressing the c-axis orientation dispersion in the granular film type recording layer and suppressing the SFD.

Example 2

Media were manufactured as follows by changing the composition of the grain diameter modulating magnetic layer of the magnetic recording medium of Example 1.

That is, the media were manufactured following the same procedures as in Example 1 except that the nonmagnetic seed layer was Al-44 at % Si/Pd (4 nm), and the SiO$_2$ content of the grain diameter modulating magnetic layer was changed between 5.5 and 9 mol %.

The SiO$_2$ content of the grain diameter modulating magnetic layer was adjusted by changing the SiO$_2$ content of a target.

The results of the XRD evaluation show that the magnetic crystal grains in the granular film type recording layer of every perpendicular magnetic recording medium had the hcp structure and were oriented in the (0001) plane.

Also, the magnetic crystal grains in the continuous film type recording layer of every perpendicular magnetic recording medium had the hcp structure and were oriented in the (0001) plane.

Ru of the nonmagnetic underlayer of every medium had the hcp structure and was oriented in the (0001) plane.

The results of the planar TEM observation indicate that the granular film type recording layer of every perpendicular magnetic recording medium had a granular structure in which the grain boundary region surrounded the magnetic crystal grains.

The results of the composition analysis by TEM-EDX demonstrate that the magnetic crystal grains in the granular film type recording layer of every perpendicular magnetic recording medium contained Co, Pt, and Cr.

Furthermore, the continuous film type recording layer of every perpendicular magnetic recording medium had a continuous film structure because no clear grain/grain boundary structure could be confirmed. The results of the composition analysis by TEM-EDX demonstrate that the continuous film type recording layer of every perpendicular magnetic recording medium contained Co, Pt, and Cr.

The nonmagnetic seed layer grain diameter of every medium was 4 to 8 nm.

The average grain diameter of the small-grain-diameter magnetic layer of every medium was 3 to 7 nm, i.e., smaller than the grain diameter of the grain diameter modulating magnetic layer.

Table 2 shows the average grain diameter d(Ru) of the nonmagnetic underlayer, the average grain diameter d(gra) of the small-grain-diameter magnetic layer, and the average grain diameter d(mod) of the grain diameter modulating magnetic layer of each magnetic recording medium. The average grain diameter of each layer was evaluated in the center of the film thickness of the layer.

Table 2 also shows the result of the composition analysis of the grain diameter modulating magnetic layer of each magnetic recording medium.

Furthermore, Table 2 shows the values of ΔHc/Hc and SNR of each magnetic recording medium.

When the average grain diameter of the grain diameter modulating magnetic layer was 7 to 10 nm, the ΔHc/Hc and SNR significantly improved. The average grain diameter of the grain diameter modulating magnetic layer could also be 8 to 9 nm. When the average grain diameter of the grain diameter modulating magnetic layer was 7 to 10 nm, the SNR improved probably mainly because the ΔHc/Hc improved.

Example 3

Magnetic recording media were manufactured as follows by changing the grain packing ratio of the small-grain-diameter magnetic layer.

That is, the media were manufactured following the same procedures as in Example 2 except that deposition was performed using a target obtained by adding 0 to 13 mol % of CoO to a small-grain-diameter magnetic layer target, and the composition of the grain diameter modulating magnetic layer was $(Co_{68}-Cr_{16}-Pt_{16})$-7 mol at % SiO$_2$.

The results of the XRD evaluation show that the magnetic crystal grains in the granular film type recording layer of every perpendicular magnetic recording medium had the hcp structure and were oriented in the (0001) plane.

Also, the magnetic crystal grains in the continuous film type recording layer of every perpendicular magnetic recording medium had the hcp structure and were oriented in the (0001) plane.

Ru of the nonmagnetic underlayer of every medium had the hcp structure and was oriented in the (0001) plane.

The results of the planar TEM observation indicate that the granular film type recording layer of every perpendicular magnetic recording medium had a granular structure in which the grain boundary region surrounded the magnetic crystal grains.

The results of the composition analysis by TEM-EDX demonstrate that the magnetic crystal grains in the granular film type recording layer of every perpendicular magnetic recording medium contained Co, Pt, and Cr.

Furthermore, the continuous film type recording layer of every perpendicular magnetic recording medium had a continuous film structure because no clear grain/grain boundary structure could be confirmed. The results of the composition analysis by TEM-EDX demonstrate that the continuous film type recording layer of every perpendicular magnetic recording medium contained Co, Pt, and Cr.

The nonmagnetic seed layer grain diameter of every medium was 4 to 8 nm.

The average grain diameter of the small-grain-diameter magnetic layer of every medium was 3 to 7 nm, i.e., smaller than the grain diameter of the grain diameter modulating magnetic layer.

Tables 3 and 4 show the average grain diameter d(Ru) of the nonmagnetic underlayer, the average grain diameter d(gra) of the small-grain-diameter magnetic layer, the average grain diameter d(mod) of the grain diameter modulating magnetic layer, a grain packing ratio (P(gra)) of the small-grain-diameter magnetic layer, and a grain packing ratio (P(mod)) of the grain diameter modulating magnetic layer of each magnetic recording medium. The average grain diameter and grain packing ratio of each layer were evaluated in the center of the film thickness of the layer.

Tables 3 and 4 also show the results of the composition analysis of the small-grain-diameter magnetic layer and small-grain-diameter magnetic layer target of each magnetic recording medium.

Furthermore, Tables 3 and 4 show the values of ΔHc/Hc and SNR of each magnetic recording medium.

When the grain packing ratio of the small-grain-diameter magnetic layer was 50% to 70%, the SNR improved compared to that of the magnetic recording medium of Example 1. The grain packing ratio of the small-grain-diameter magnetic layer could also be 60% to 65%. On the other hand, the ΔHc/Hc exhibited no remarkable improvement. Therefore, when the grain packing ratio of the small-grain-diameter magnetic layer was 50% to 70%, the SNR improved presumably mainly because the exchange interaction in the small-grain-diameter magnetic layer reduced.

In addition, when the amount of CoO added to the small-grain-diameter magnetic layer target was 0.5 to 12 mol %, it was possible to appropriately reduce the grain packing ratio of the small-grain-diameter magnetic layer, and improve the SNR. The CoO addition amount could also be 6 to 10 mol %.

Furthermore, even when CoO was added to the target, CoO did not necessarily form in the film, and Cr often oxidized instead.

Example 4

Magnetic recording media were manufactured as follows by changing the grain packing ratio of the grain diameter modulating magnetic layer.

That is, the media were manufactured following the same procedures as in Example 3 except that the amount of CoO to be added to the small-grain-diameter magnetic layer target was fixed to 6 mol %, and the amount of $Cr_2O_3$ to be added to the grain diameter modulating magnetic layer target was changed from 0 to 7 mol %.

The results of the XRD evaluation show that the magnetic crystal grains in the granular film type recording layer of every perpendicular magnetic recording medium had the hcp structure and were oriented in the (0001) plane.

Also, the magnetic crystal grains in the continuous film type recording layer of every perpendicular magnetic recording medium had the hcp structure and were oriented in the (0001) plane.

Ru of the nonmagnetic underlayer of every medium had the hcp structure and was oriented in the (0001) plane.

The results of the planar TEM observation indicate that the granular film type recording layer of every perpendicular magnetic recording medium had a granular structure in which the grain boundary region surrounded the magnetic crystal grains.

The results of the composition analysis by TEM-EDX demonstrate that the magnetic crystal grains in the granular film type recording layer of every perpendicular magnetic recording medium contained Co, Pt, and Cr.

Furthermore, the continuous film type recording layer of every perpendicular magnetic recording medium had a continuous film structure because no clear grain/grain boundary structure could be confirmed. The results of the composition analysis by TEM-EDX demonstrate that the continuous film type recording layer of every perpendicular magnetic recording medium contained Co, Pt, and Cr.

The nonmagnetic seed layer grain diameter of every medium was 4 to 8 nm.

The average grain diameter of the small-grain-diameter magnetic layer of every medium was 3 to 7 nm, i.e., smaller than the grain diameter of the grain diameter modulating magnetic layer.

Tables 5 and 6 show the $Cr_2O_3$ content in the small-grain-diameter magnetic layer, that in the grain diameter modulating magnetic layer, the grain packing ratio (P(gra)) of the small-grain-diameter magnetic layer, the grain packing ratio (P(mod)) of the grain diameter modulating magnetic layer, and the values of ΔHc/Hc and SNR of each magnetic recording medium.

Tables 5 and 6 show the average grain diameter d(Ru) of the nonmagnetic underlayer, the average grain diameter d(gra) of the small-grain-diameter magnetic layer, the average grain diameter d(mod) of the grain diameter modulating magnetic layer, the grain packing ratio (P(gra)) of the small-grain-diameter magnetic layer, and the grain packing ratio (P(mod)) of the grain diameter modulating magnetic layer of each magnetic recording medium. The average grain diameter and grain packing ratio of each layer were evaluated in the center of the film thickness of the layer.

The SNR remarkably improved when the grain packing ratio of the grain diameter modulating magnetic layer was 70% to 90% and higher than that of the small-grain-diameter magnetic layer. The grain packing ratio of the grain diameter modulating magnetic layer could also be 80% to 85%.

In addition, the SNR noticeably improved when the $Cr_2O_3$ content in the grain diameter modulating magnetic layer was smaller than that in the small-grain-diameter magnetic layer.

Also, the $Cr_2O_3$ content added to the target did not necessarily match that in the film: the $Cr_2O_3$ content in the film was often lower.

Example 5

Magnetic recording media were manufactured as follows by changing the small-grain-diameter magnetic layer to a double-layered structure including two layers different in Cr content of magnetic crystal grains.

That is, the media were manufactured following the same procedures as in Example 4 except that the amount of $Cr_2O_3$ to be added to the grain diameter modulating magnetic layer target was fixed to 3 mol %, and the Cr addition amount was changed for each of the two small-grain-diameter magnetic layers. The film thickness of the lower small-grain-diameter magnetic layer was 4 nm, and that of the upper small-grain-diameter magnetic layer was 8 nm.

The results of the XRD evaluation show that the magnetic crystal grains in the granular film type recording layer of every perpendicular magnetic recording medium had the hcp structure and were oriented in the (0001) plane.

Also, the magnetic crystal grains in the continuous film type recording layer of every perpendicular magnetic recording medium had the hcp structure and were oriented in the (0001) plane.

Ru of the nonmagnetic underlayer of every medium had the hcp structure and was oriented in the (0001) plane.

The results of the planar TEM observation indicate that the granular film type recording layer of every perpendicular magnetic recording medium had a granular structure in which the grain boundary region surrounded the magnetic crystal grains.

The results of the composition analysis by TEM-EDX demonstrate that the magnetic crystal grains in the granular film type recording layer of every perpendicular magnetic recording medium contained Co, Pt, and Cr.

Furthermore, the continuous film type recording layer of every perpendicular magnetic recording medium had a continuous film structure because no clear grain/grain boundary structure could be confirmed. The results of the composition analysis by TEM-EDX demonstrate that the continuous film type recording layer of every perpendicular magnetic recording medium contained Co, Pt, and Cr.

The nonmagnetic seed layer grain diameter of every medium was 4 to 8 nm.

The average grain diameter of the small-grain-diameter magnetic layer of every medium was 3 to 7 nm, i.e., smaller than the grain diameter of the grain diameter modulating magnetic layer.

Tables 7 and 8 show the Cr content in the small-grain-diameter magnetic layer (lower layer), that in the small-grain-diameter magnetic layer (upper layer), and the values of ΔHc/Hc and SNR.

Tables 7 and 8 also show the average grain diameter d(Ru) of the nonmagnetic underlayer, an average grain diameter d(gra lower) of the small-grain-diameter magnetic layer (lower layer), an average grain diameter d(gra upper) of the small-grain-diameter magnetic layer (upper layer), the average grain diameter d(mod) of the grain diameter modulating magnetic layer, a grain packing ratio (P(gra lower)) of the small-grain-diameter magnetic layer (lower layer), a grain packing ratio (P(gra upper)) of the small-grain-diameter magnetic layer (upper layer), and the grain packing ratio (P(mod)) of the grain diameter modulating magnetic layer of each magnetic recording medium. The average grain diameter and grain packing ratio of each layer were evaluated in the center of the film thickness of the layer.

In addition, Tables 7 and 8 show the results of the analysis of the Cr contents in the crystal grains of the small-grain-diameter magnetic layer (upper layer) and small-grain-diameter magnetic layer (lower layer) of each magnetic recording medium.

Furthermore, Tables 7 and 8 show the values of ΔHc/Hc and SNR of each magnetic recording medium.

When compared to Example 4, the SNR notably improved when the small-grain-diameter magnetic layer was given the double-layered structure, and the Cr content in the small-grain-diameter magnetic layer (lower layer) was made lower than that in the small-grain-diameter magnetic layer (upper layer).

Also, the SNR improved when the Cr content in the small-grain-diameter magnetic layer (lower layer) was 0 to 12 at %. The Cr content in the small-grain-diameter magnetic layer (lower layer) could also be 8 to 10 at %.

Furthermore, the SNR improved when the Cr content in the small-grain-diameter magnetic layer (upper layer) was 12 to 18 at %. The Cr content in the small-grain-diameter magnetic layer (upper layer) could also be 14 to 17 at %.

Example 6

Magnetic recording media were manufactured as follows by changing the nonmagnetic seed layer.

That is, the media were manufactured following the same procedures as in Example 5 except that the Cr content in the small-grain-diameter magnetic layer (lower layer) was fixed to 10 at %, that in the small-grain-diameter magnetic layer (upper layer) was fixed to 16 at %, and the nonmagnetic seed layer was changed to Si (5 nm)/Pd (4 nm), Ru-30 at % Si (5 nm)/Pd (4 nm), Pd-67 at % Si (5 nm)/Pd (4 nm), Si (5 nm)/Pt (4 nm), Al-44 at % Si (5 nm)/Pt (4 nm), Ru-30 at % Si (5 nm)/Pt (4 nm), or Pd-67 at % Si (5 nm)/Pt (4 nm).

The results of the XRD evaluation show that the magnetic crystal grains in the granular film type recording layer of every perpendicular magnetic recording medium had the hcp structure and were oriented in the (0001) plane.

Also, the magnetic crystal grains in the continuous film type recording layer of every perpendicular magnetic recording medium had the hcp structure and were oriented in the (0001) plane.

Ru of the nonmagnetic underlayer of every medium had the hcp structure and was oriented in the (0001) plane.

The results of the planar TEM observation indicate that the granular film type recording layer of every perpendicular magnetic recording medium had a granular structure in which the grain boundary region surrounded the magnetic crystal grains.

The results of the composition analysis by TEM-EDX demonstrate that the magnetic crystal grains in the granular film type recording layer of every perpendicular magnetic recording medium contained Co, Pt, and Cr.

Furthermore, the continuous film type recording layer of every perpendicular magnetic recording medium had a continuous film structure because no clear grain/grain boundary structure could be confirmed. The results of the composition analysis by TEM-EDX demonstrate that the continuous film type recording layer of every perpendicular magnetic recording medium contained Co, Pt, and Cr.

TABLE 1

|  | Non-magnetic seed layer | d (Ru) [nm] | d (gra) [nm] | d (mod) [nm] | $\Delta\theta_{50}$ [°] | $\Delta Hc/Hc$ | SNR [dB] |
|---|---|---|---|---|---|---|---|
| Comparative Example 6 | AlSi/Pd (1 nm) | 3.6 | 2.7 | 10.1 | 3.3 | 0.23 | 9.0 |
| Example 1-1 | AlSi/Pd (2 nm) | 4.0 | 3.0 | 10.1 | 3.2 | 0.17 | 11.1 |
| Example 1-2 | AlSi/Pd (3 nm) | 5.0 | 4.0 | 10.3 | 3.2 | 0.16 | 12.0 |
| Example 1-3 | AlSi/Pd (4 nm) | 7.0 | 6.0 | 10.3 | 3.1 | 0.16 | 12.0 |
| Example 1-4 | AlSi/Pd (6 nm) | 8.0 | 7.0 | 10.4 | 3.0 | 0.18 | 11.0 |
| Comparative Example 7 | AlSi/Pd (8 nm) | 8.5 | 7.4 | 10.4 | 3.0 | 0.23 | 9.3 |
| Comparative Example 1 | Pd (6 nm) | 9.6 | 9.0 | — | 3.1 | 0.15 | 8.8 |
| Comparative Example 2 | AlSi/Pd (4 nm) | 7.0 | 6.0 | — | 3.1 | 0.30 | 9.1 |
| Comparative Example 3 | Pd (6 nm) | 9.6 | 6.0 | 10.4 | 9.0 | 0.38 | 7.8 |
| Comparative Example 4 | AlSi/Pd (4 nm) | 7.0 | — | 11.2 | — | 0.10 | 5.7 |
| Comparative Example 5 | AlSi/Pd (4 nm) | 7.0 | 7.0 | 11.2 | 3.0 | 0.31 | 8.9 |

TABLE 2

|  | Grain size modulating layer composition | d (Ru) [nm] | d (gra) [nm] | d (mod) [nm] | $\Delta Hc/Hc$ | SNR [dB] |
|---|---|---|---|---|---|---|
| Example 2-1 | (Co-16 at % Cr-10 at % Pt)-9 mol % SiO$_2$ | 7.0 | 6.0 | 6.7 | 0.23 | 12.0 |
| Example 2-2 | (Co-16 at % Cr-10 at % Pt)-8.5 mol % SiO$_2$ | 7.0 | 6.0 | 7.0 | 0.17 | 13.4 |
| Example 2-3 | (Co-16 at % Cr-10 at % Pt)-8 mol % SiO$_2$ | 7.0 | 6.0 | 7.6 | 0.16 | 13.4 |
| Example 2-4 | (Co-16 at % Cr-10 at % Pt)-7.5 mol % SiO$_2$ | 7.0 | 6.0 | 8.0 | 0.14 | 14.1 |
| Example 2-5 | (Co-16 at % Cr-10 at % Pt)-7 mol % SiO$_2$ | 7.0 | 6.0 | 8.5 | 0.14 | 14.1 |
| Example 2-6 | (Co-16 at % Cr-10 at % Pt)-6.5 mol % SiO$_2$ | 7.0 | 6.0 | 9.0 | 0.13 | 13.4 |
| Example 2-7 | (Co 16 Cr at % -10 at % Pt)-6 mol % SiO$_2$ | 7.0 | 6.0 | 10.0 | 0.16 | 13.4 |
| Example 1-3 | (Co-16 at % Cr-10 at % Pt)-5.5 mol % SiO$_2$ | 7.0 | 6.0 | 10.3 | 0.16 | 12.0 |

TABLE 3

|  | Small-grain-size magnetic layer target composition | Small-grain-size magnetic layer composition |
|---|---|---|
| Example 2-5 | (Co—16Cr—10Pt)—10 mol % SiO$_2$ | (Co—16Cr—10Pt)—10 mol % SiO$_2$ |
| Example 3-1 | (Co—16Cr—10Pt)—10 mol % SiO$_2$—0.5 mol % CoO | (Co—16Cr—10Pt)—10 mol % SiO$_2$—1 mol % Cr$_2$O$_3$ |
| Example 3-2 | (Co—16Cr—10Pt)—10 mol % SiO$_2$—1 mol % CoO | (Co—15Cr—10Pt)—10 mol % SiO$_2$—1.5 mol % Cr$_2$O$_3$ |
| Example 3-3 | (Co—16Cr—10Pt)—10 mol % SiO$_2$—5 mol % CoO | (Co—14Cr—10Pt)—10 mol % SiO$_2$—2 mol % Cr$_2$O$_3$ |
| Example 3-4 | (Co—16Cr—10Pt)—10 mol % SiO$_2$—6 mol % CoO | (Co—14Cr—10Pt)—10 mol % SiO$_2$—2.5 mol % Cr$_2$O$_3$ |
| Example 3-5 | (Co—16Cr—10Pt)—10 mol % SiO$_2$—10 mol % CoO | (Co—13Cr—10Pt)—10 mol % SiO$_2$—3 mol % Cr$_2$O$_3$ |
| Example 3-6 | (Co—16Cr—10Pt)—10 mol % SiO$_2$—11 mol % CoO | (Co—12Cr—10Pt)—10 mol % SiO$_2$—3.5 mol % Cr$_2$O$_3$ |
| Example 3-7 | (Co—16Cr—10Pt)—10 mol % SiO$_2$—12 mol % CoO | (Co—12Cr—10Pt)—10 mol % SiO$_2$—4 mol % Cr$_2$O$_3$ |
| Example 3-8 | (Co—16Cr—10Pt)—10 mol % SiO$_2$—13 mol % CoO | (Co—11Cr—10Pt)—10 mol % SiO$_2$—4.5 mol % Cr$_2$O$_3$ |

The nonmagnetic seed layer grain diameter of every medium was 4 to 8 nm.

The average grain diameter of the small-grain-diameter magnetic layer of every medium was 3 to 7 nm, i.e., smaller than the grain diameter of the grain diameter modulating magnetic layer.

When the SNR was evaluated by a spinstand, every medium had a high SNR as in Example 5.

TABLE 4

|  | d (Ru) [nm] | d (gra) [nm] | d (mod) [nm] | P (gra) [%] | P (mod) [%] | $\Delta Hc/Hc$ | SNR [dB] |
|---|---|---|---|---|---|---|---|
| Example 2-5 | 7.0 | 6.0 | 8.5 | 76 | 91 | 0.14 | 14.1 |
| Example 3-1 | 7.0 | 6.0 | 8.5 | 70 | 91 | 0.15 | 15.0 |
| Example 3-2 | 7.0 | 5.9 | 8.5 | 68 | 91 | 0.16 | 15.0 |
| Example 3-3 | 7.0 | 5.5 | 8.5 | 66 | 91 | 0.16 | 15.1 |

TABLE 4-continued

| | d (Ru) [nm] | d (gra) [nm] | d (mod) [nm] | P (gra) [%] | P (mod) [%] | ΔHc/Hc | SNR [dB] |
|---|---|---|---|---|---|---|---|
| Example 3-4 | 7.0 | 5.4 | 8.5 | 65 | 91 | 0.16 | 16.1 |
| Example 3-5 | 7.0 | 5.4 | 8.5 | 60 | 91 | 0.16 | 16.2 |
| Example 3-6 | 7.0 | 5.2 | 8.5 | 58 | 91 | 0.17 | 15.2 |
| Example 3-7 | 7.0 | 5.2 | 8.5 | 50 | 91 | 0.17 | 15.1 |
| Example 3-8 | 7.0 | 5.2 | 8.5 | 48 | 91 | 0.17 | 16 |

TABLE 5

| | Grain size modulating magnetic layer target composition | $Cr_2O_3$ content in small-grain-size magnetic layer [mol. %] | $Cr_2O_3$ content (mod) in grain size modulating magnetic layer [mol. %] |
|---|---|---|---|
| Example 4-1 | (Co—16Cr—10Pt)—7 mol % $SiO_2$—7 mol % $Cr_2O_3$ | 5 | 5 |
| Example 4-2 | (Co—16Cr—10Pt)—7 mol % $SiO_2$—6 mol % $Cr_2O_3$ | 5 | 4 |
| Example 4-3 | (Co—16Cr—10Pt)—7 mol % $SiO_2$—5 mol % $Cr_2O_3$ | 5 | 2 |
| Example 4-4 | (Co—16Cr—10Pt)—7 mol % $SiO_2$—4 mol % $Cr_2O_3$ | 5 | <1 |
| Example 4-5 | (Co—16Cr—10Pt)—7 mol % $SiO_2$—3 mol % $Cr_2O_3$ | 5 | <1 |
| Example 4-6 | (Co—16Cr—10Pt)—7 mol % $SiO_2$—2 mol % $Cr_2O_3$ | 5 | <1 |
| Example 4-7 | (Co—16Cr—10Pt)—7 mol % $SiO_2$—1 mol % $Cr_2O_3$ | 5 | 0 |
| Example 3-3 | (Co—16Cr—10Pt)—7 mol % $SiO_2$ | 2.5 | 0 |

TABLE 6

| | d (Ru) [nm] | d (gra) [nm] | d (mod) [nm] | P (gra) [%] | P (mod) [%] | ΔHc/Hc | SNR [dB] |
|---|---|---|---|---|---|---|---|
| Example 4-1 | 7.0 | 5.4 | 8.1 | 65 | 68 | 0.2 | 16.1 |
| Example 4-2 | 7.0 | 5.4 | 8.2 | 65 | 70 | 0.17 | 16.9 |
| Example 4-3 | 7.0 | 5.4 | 8.3 | 65 | 78 | 0.17 | 17.0 |
| Example 4-4 | 7.0 | 5.4 | 8.3 | 65 | 80 | 0.16 | 18.0 |
| Example 4-5 | 7.0 | 5.4 | 8.4 | 65 | 85 | 0.16 | 18.0 |
| Example 4-6 | 7.0 | 5.4 | 8.4 | 65 | 87 | 0.16 | 17.1 |
| Example 4-7 | 7.0 | 5.4 | 8.5 | 65 | 90 | 0.16 | 17.0 |
| Example 3-3 | 7.0 | 5.4 | 8.5 | 65 | 91 | 0.16 | 16.1 |

TABLE 7

| | Cr content in small-grain-size magnetic layer (lower layer) [at. %] | Cr content in small-grain-size magnetic layer (upper layer) [at. %] | d(Ru) [nm] | d(gra lower) [nm] | d(gra upper) [nm] |
|---|---|---|---|---|---|
| Example 4-5 | — | 16 | 7.0 | — | 5.4 |
| Example 5-1 | 0 | 16 | 7.0 | 5.6 | 5.4 |
| Example 5-2 | 4 | 16 | 7.0 | 5.6 | 5.4 |
| Example 5-3 | 7 | 16 | 7.0 | 5.6 | 5.4 |
| Example 5-4 | 8 | 16 | 7.0 | 5.5 | 5.4 |
| Example 5-5 | 10 | 16 | 7.0 | 5.5 | 5.4 |
| Example 5-6 | 12 | 16 | 7.0 | 5.5 | 5.4 |
| Example 5-7 | 17 | 16 | 7.0 | 5.4 | 5.4 |
| Example 5-8 | 10 | 10 | 7.0 | 5.5 | 5.7 |
| Example 5-9 | 10 | 12 | 7.0 | 5.5 | 5.7 |
| Example 5-10 | 10 | 14 | 7.0 | 5.5 | 5.6 |
| Example 5-11 | 10 | 17 | 7.0 | 5.5 | 5.4 |
| Example 5-12 | 10 | 19 | 7.0 | 5.5 | 5.3 |

TABLE 8

| | d (mod) [nm] | P (gra lower) [%] | P (gra upper) [%] | P (mod) [%] | ΔHc/Hc | SNR [dB] |
|---|---|---|---|---|---|---|
| Example 4-5 | 8.4 | — | 65 | 85 | 0.16 | 18.0 |
| Example 5-1 | 8.4 | 67 | 65 | 85 | 0.14 | 18.7 |
| Example 5-2 | 8.4 | 67 | 65 | 85 | 0.14 | 18.7 |
| Example 5-3 | 8.4 | 67 | 65 | 85 | 0.14 | 18.8 |
| Example 5-4 | 8.4 | 66 | 65 | 85 | 0.11 | 19.7 |
| Example 5-5 | 8.4 | 66 | 65 | 85 | 0.11 | 19.8 |
| Example 5-6 | 8.4 | 66 | 65 | 85 | 0.15 | 18.6 |
| Example 5-7 | 8.4 | 65 | 65 | 85 | 0.18 | 17.9 |
| Example 5-8 | 8.4 | 66 | 67 | 85 | 0.13 | 17.9 |
| Example 5-9 | 8.4 | 66 | 67 | 85 | 0.13 | 18.9 |
| Example 5-10 | 8.4 | 66 | 66 | 85 | 0.12 | 19.6 |
| Example 5-11 | 8.4 | 66 | 65 | 85 | 0.11 | 19.7 |
| Example 5-12 | 8.4 | 66 | 64 | 85 | 0.16 | 18.9 |

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a perpendicular magnetic recording medium, the method comprising:
    forming a soft magnetic underlayer on a substrate;
    forming a nonmagnetic seed layer on the soft magnetic underlayer;
    forming a nonmagnetic underlayer on the nonmagnetic seed layer; and
    forming a granular film-type recording layer on the nonmagnetic underlayer, wherein the granular film-type recording layer comprises magnetic crystal grains and a nonmagnetic grain boundary region surrounding the magnetic crystal grains, and thereafter forming a continuous film-type recording layer,
    wherein the nonmagnetic underlayer has an average crystal grain diameter of 4 to 8 nm in a film plane, wherein forming the granular film-type recording layer comprises forming, on the nonmagnetic underlayer, a first granular film-type recording layer in which magnetic crystal grains in a film plane have an average crystal grain diameter of 3 to 7 nm, and forming, on the first granular film-type recording layer, a second granular film-type recording layer in which magnetic crystal grains in a film plane are larger than the average crystal grain diameter of the crystal grains in the first granular film-type recording layer, wherein forming the first granular film-type recording layer comprises performing sputtering by using a sputtering target consisting of Si oxide, Co oxide, and a CoCrPt alloy to form the first granular film-type recording layer consisting of the magnetic crystal grains consisting of cobalt, chromium, and platinum, and the nonmagnetic grain boundary region surrounding the magnetic crystal grains, wherein the nonmagnetic grain boundary region consists of Si oxide and Cr oxide, wherein the Cr oxide is deposited by oxidizing Cr in the CoCrPt alloy with Co oxide during sputtering, such that CoO does not substantially form in the first granular film-type recording layer, wherein the first granular film-type recording layer has a range of 1-4.5 mol% of the $Cr_2O_3$, wherein the Co oxide amount in the sputtering target of the first granular film-type recording layer is 6 to 10 mol%, and wherein a total ratio of the Si oxide and Cr oxide forming the nonmagnetic grain boundary region to the CoCrPt alloy forming the magnetic crystal grains is 5 to 15 mol%.

2. The method of claim 1, wherein forming the second granular film-type recording layer comprises performing sputtering by using a sputtering target comprising Si oxide, Co oxide, and a CoCrPt alloy, and wherein the Co oxide content in the sputtering target of the second granular film-type recording layer is lower than that in the sputtering target of the first granular film-type recording layer.

* * * * *